United States Patent [19]
Doi et al.

[11] Patent Number: 5,459,108
[45] Date of Patent: Oct. 17, 1995

[54] NORMAL PRESSURE CVD PROCESS FOR MANUFACTURE OF A SEMICONDUCTOR DEVICE THROUGH REACTION OF A NITROGEN CONTAINING ORGANIC SOURCE WITH OZONE

[75] Inventors: Tsukasa Doi, Kitakatsuragi; Yukiko Mori, Tenri, both of Japan

[73] Assignee: Sharp Kabushiki Kaisha, Osaka, Japan

[21] Appl. No.: 98,927

[22] Filed: Jul. 29, 1993

[30] Foreign Application Priority Data

Oct. 6, 1992 [JP] Japan ..................... 4-267231
Apr. 30, 1993 [JP] Japan ..................... 5-104098

[51] Int. Cl.$^6$ ............................. H01L 21/316
[52] U.S. Cl. ..................... 437/238; 148/DIG. 118
[58] Field of Search ..................... 437/238, 235; 148/DIG. 118

[56] References Cited

U.S. PATENT DOCUMENTS

| | | | |
|---|---|---|---|
| 4,845,054 | 7/1989 | Mitchener | 437/238 |
| 5,051,380 | 9/1991 | Maeda et al. | 148/DIG. 118 |
| 5,094,983 | 3/1992 | Furthaler et al. | 437/238 |
| 5,262,358 | 11/1993 | Sigmund et al. | 148/DIG. 118 |
| 5,290,736 | 3/1994 | Sato et al. | 437/238 |

FOREIGN PATENT DOCUMENTS

| | | | |
|---|---|---|---|
| 3933908 | 4/1991 | Germany | 437/238 |
| 492427A | 3/1992 | Japan | 437/238 |

OTHER PUBLICATIONS

Garcia et al, Journal of Chemical Vapor Deposition Copyright 1994, ACS, vol. 1–Jan. 1993, pp. 232–251.

*Primary Examiner*—Olik Chaudhuri
*Assistant Examiner*—S. Mulpuri
*Attorney, Agent, or Firm*—Nixon & Vanderhye

[57] ABSTRACT

There is provided a semiconductor device manufacturing process which enables film deposition at low temperatures and can produce an interlayer insulating film of good quality which exhibits good surface smoothing effect. In the TEOS-$O_3$ system normal pressure CVD process, film growth is carried out by adding to TEOS source a source containing nitrogen in its composition. For the source is used heptamethyl disilazane (chemical formula $(CH_3)_3SiN(CH_3)Si(CH_3)_3$), N, O-bis-trimethylsilyl acetamide (chemical formula $(CH_3)C(OSi(CH_3)_3)(NSi(CH_3)_3)$) or tridimethylamino silane (chemical formula $(CH_3)_2N)_3SiN$). Also, there is provided a semiconductor device manufacturing method which enables film deposition at a uniform growth rate irrespective of the substrate material and can produce a silicon oxide film of good quality which exhibits good surface smoothing effect. An organic source having an Si—N bond in its composition and $O_3$ are conducted to the substrate and reacted with each other under normal pressure whereby a silicon oxide film is grown on the substrate. The organic source is, for example, hexamethyl disilazane $((CH_3)_3Si—N(H)—Si(CH_3)_3)$.

7 Claims, 8 Drawing Sheets

NORMAL PRESSURE CVD PROCESS FOR MANUFACTURE OF A SEMICONDUCTOR DEVICE THROUGH REACTION OF A NITROGEN CONTAINING ORGANIC SOURCE WITH OZONE

BACKGROUND OF THE INVENTION

1. Field of the Invention

The present invention relates to a process for manufacture of a semiconductor device and, more particularly, to a chemical vapor deposition process (normal pressure CVD process) in which an organic source is caused to react with ozone under normal pressure.

2. Description of the Prior Art

Recently, semiconductor devices are generally oriented toward greater compactness and a higher degree of integration and accordingly there has arisen the need for multi-layer wiring. In order to meet such need, as a promising interlayer insulation film forming method, a so-called TEOS (tetraethoxy-silane)-$O_3$ (ozone) system normal pressure CVD process has been receiving attention which enables films to be formed at a low temperature (on the order of 400° C.) and provides a high degree of flat covering. The TEOS-$O_3$ system normal pressure CVD process is a process in which TEOS (as, for example, bubbled with $N_2$ gas) and $O_3$ (with $O_2$ used a carrier gas) are conducted onto a substrate kept at a predetermined temperature and are caused to react with each other under normal pressure so that silicon oxide is deposited on the substrate.

However, with the above described normal pressure CVD process of the conventional TEOS-$O_3$ system, there is a problem that since the deposited film contains 1 to 3 wt % of hydrogen in terms of moisture content (which is present in the state of Si—OH), the film is subjected to quality deterioration or ohmic contact between multi-layer conductor lines is likely to be interfered. This adversely affects the reliability of the semiconductor device. The above noted hydrogen content may be somewhat reduced by heat treatment at a temperature of not less than 700° C. Where an inter-layer insulating film is to be formed between metal conductor layers, however, heat treatment at such a high temperature cannot be carried out from the standpoint of metal reliability maintenance.

Further, the TEOS-$O_3$ system normal pressure CVD process involves the problem that the growth rate of silicon oxide depends upon the material of the substrate. More specifically, where the substrate is made of single-crystal Si, poly Si, or metal, the rate of such growth is higher, while the growth rate is lower where the substrate is made of plasma $SiO_2$ or thermal (thermally oxidized) $SiO_2$ (and a median growth rate prevails where the substrate is of SiN). FIG. 8 illustrates by way of example how growth rate differs between poly Si and thermal $SiO_2$ when respectively used as substrates (□ represents rate of growth on the poly Si substrate, and ○ represents rate of growth on the thermal $SiO_2$ substrate). Since the rate of growth varies in this way depending upon the kind of substrate material, when deposition is made over lines of metal wiring laid at a predetermined pitch on an insulating film (i.e., at a metal layer covering stage), step coverage may be so unfavorable that no good surface smoothness can be achieved.

In order to avoid this problem, an attempt has been made such that at the metal layer covering stage, a silicon oxide film (plasma TEOS film) is first made from TEOS by the plasma CVD process and thereafter a silicon oxide film is formed by the TEOS-$O_3$ system normal pressure CVD process. However, this attempt involves an increase in the number of stages and, in addition, has a disadvantage that at a sub-halfmicron zone, the step coverage of the plasma TEOS film per se is so unfavorable that no good surface smoothness can be obtained.

In the TEOS-$O_3$ system normal pressure CVD process, the dependence of film growth rate may be overcome by decreasing the ozone concentration to about 0.5 to 1.5 wt %. However, this will result in increased film shrinkage by annealing and thus adversely affect the quality of the silicon oxide film formed.

SUMMARY OF THE INVENTION

It is therefore an object of the present invention to provide a process for manufacturing semiconductor devices which enables film forming at low temperatures, provides good surface smoothness, and can form an interlayer insulating film of satisfactory quality.

In order to achieve the aforementioned object, the present invention provides a process for manufacturing semiconductor devices which includes the steps of conducting to a substrate an organic source containing Si in its composition and $O_3$, causing the organic source and $O_3$ to chemically react with each other under normal pressures thereby to grow a silicon oxide film on the substrate, the process comprising: effecting the growth of the silicon oxide film by adding to the organic source a source containing nitrogen in its composition (hereinafter referred to as "nitrogen" source).

The nitrogen source is preferably heptamethyl disilazane (chemical formula: $(CH_3)_3SiN(CH_3)Si(CH_3)_3$).

Again, the nitrogen source is preferably N, O-bis-trimethylsilyl acetamide (chemical formula: $(CH_3)C(OSi(CH_3)_3)(NSi(CH_3)_3)$).

Again, the nitrogen source is preferably tridimethylamino silane (chemical formula: $((CH_3)_2N)_3SiN$).

OH groups, when they are going to be taken into the film, are replaced by nitrogen N contained in the nitrogen source. That is, Si—N is formed in place of Si—OH and hydrogen escapes into the atmosphere in the form of $H_2$. Thus, the moisture content of the film is reduced so that the quality of the film is satisfactorily improved. The semiconductor manufacturing process of the invention comes under the category of the organic source-$O_3$ system normal pressure CVD process. Therefore, in same manner as in the conventional TEOS-$O_3$ system normal pressure CVD process, film deposition can be effected at low temperatures and good surface smoothness can be achieved.

Where the nitrogen source is heptamethyl disilazane, N, O-bis-trimethylsilyl acetamide, or tridimethylamino silane, the vapor pressure is substantially equal to that in case of TEOS, as shown in FIG. 2 which illustrates the relationship between vapor pressure and temperature with respect to individual nitrogen sources. Therefore, addition of the nitrogen source to the TEOS source (organic source) system can be easily effected by bubbling. Furthermore, this enables carbon to be excluded from the silicon oxide film in the stage of growth, as will be hereinafter described.

It is another object of the invention to provide a semiconductor manufacturing process which enables film growth at a uniform rate irrespective of the material of the substrate and achieves good surface smoothness i.e. uniform thickness covering, and yet which enables deposition of good quality silicon oxide films.

In order to accomplish the above object, the present invention provides a process for manufacturing semiconductor devices which includes the steps of conducting an organic source and $O_3$ to a substrate and causing the organic source and $O_3$ to chemically react with each other under normal pressures thereby to grow a silicon oxide film on the substrate, wherein: the organic source has an Si—N bond in its composition.

The organic source is preferably a hexamethyl disilazane.

The present inventor conducted experiments on various kinds of organic source materials and, as a result, it was discovered that where a material having an Si—N bond in its composition was used as an organic source, the silicon oxide film formed had no dependence upon the material of the substrate and could exhibit good surface smoothing effect. The organic source is, for example, hexamethyl disilazane. The ozone concentration at the stage of film growth may be a conventional level of 5 wt %. The use of the organic source enabled growth of a good quality silicon oxide film.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

To describe the semiconductor device manufacturing process of the invention in further detail, the following examples are given.

(FIRST EXAMPLE)

Figure 1:
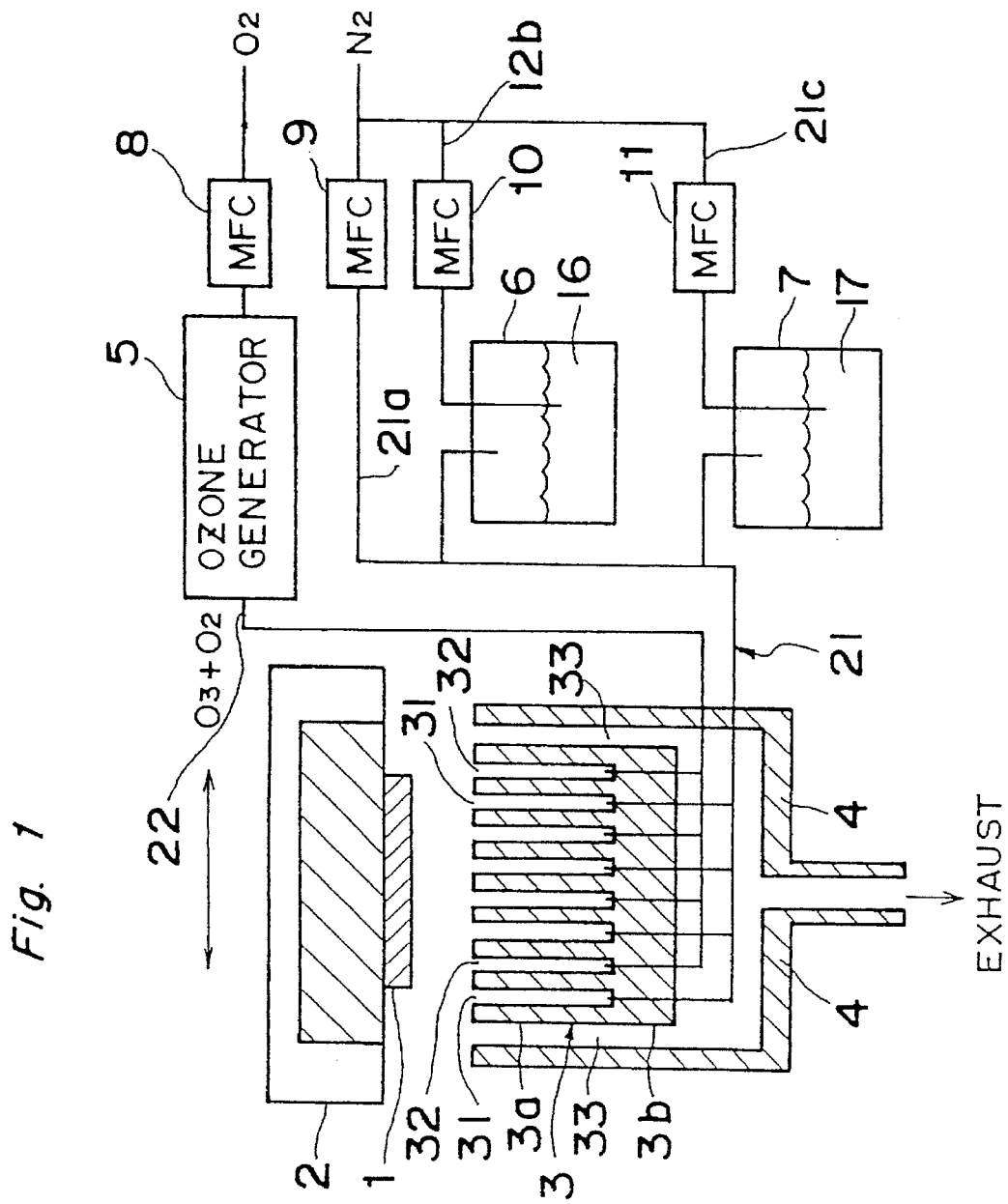
FIG. 1 is a block diagram showing a TEOS-$O_3$ system normal pressure CVD apparatus employed in growing a silicon oxide film in one example of the process of the invention.

FIG. 1 illustrates a TEOS-$O_3$ system normal pressure CVD apparatus for growing a silicon oxide film according to this first example of the process of the invention. The apparatus includes a heater 2 capable of keeping a substrate 1 at a predetermined temperature, and a dispersion head 3 facing the substrate 1 and covered with a cover 4. At the substrate side 3a of the dispersion head 3 are alternately arranged slits 31, 32 for jetting gases. At a lower portion 3b of the head 3 a gas system 21 is connected to the slits 31 for supply of an organic source thereto, and a gas system 22 is connected to the slits 32 for supply of $O_3$ and $O_2$ gases thereto. A carrier $N_2$ system 21a, a TEOS source system 21b, and a nitrogen source system 21c join into the gas system 21. The carrier $N_2$ system 21a has a mass flow controller 9 and supplies carrier $N_2$ gas to the dispersion head 3 at a predetermined flow rate. The TEOS source system 21b has a mass flow controller 10 and a source vessel 6 in which TEOS source 16 is stored, and supplies to the dispersion head 3 TEOS source 16 bubbled with a predetermined flow of $N_2$ gas. The nitrogen source system 21c has a mass flow controller 11 and a source vessel 7 in which nitrogen source 17 is stored, and supplies to the dispersion head 3 nitrogen source 17 bubbled with a predetermined flow of $N_2$ gas. For the nitrogen source 17 are used heptamethyl disilazane (chemical formula: $(CH_3)_3SiN(CH_3)Si(CH_3)_3$), N, O-bis-trimethylsilyl acetamide (chemical formula: $(CH_3)C(OSi(CH_3)_3)(NSi(CH_3)_3)$), tridimethylamino silane (chemical formula: $((CH_3)_2N)_3SiN$) and so on, in all of which vapor pressure is close to that in the case of TEOS. The gas system 22 has a mass controller 8 and an ozone generator 5, and supplies $O_3$ and $O_2$ gases to the dispersion head 3 at predetermined flow rates and in predetermined proportions.

For actual film growth, the temperature of the substrate 1 is set at 400° C. by the heater 2, and the temperature of the TEOS source 16 and nitrogen source 17 each is kept at 65° C. The flow rate of carrier $N_2$ gas is set at 18 liters/min., the flow rate of $N_2$ gas for bubbling the TEOS source 16 at 1.8 to 2.2 liters/min., and the flow rate of $N_2$ gas for bubbling the nitrogen source 17 at 0.1 to 2.0 liters/min., respectively by the mass flow controllers 9, 10 and 11. The flow rate of $O_2$ gas is set at 7.5 liters/min. by the mass flow controller 8, and the amount of $O_3$ in the $O_2$ gas is set at 5 wt % by the ozone generator 5. Under these growth conditions, the different gases are directed to the substrate 1 via the slits 31, 32 while the substrate 1 is moved rightward and leftward in FIG. 1, so that silicon oxide film is grown. Gases after reaction are exhausted through a clearance 33 between the head 3 and the cover 4. A silicon oxide film having good surface covering characteristics was grown to a thickness of about 2000 Å.

Figure 2:
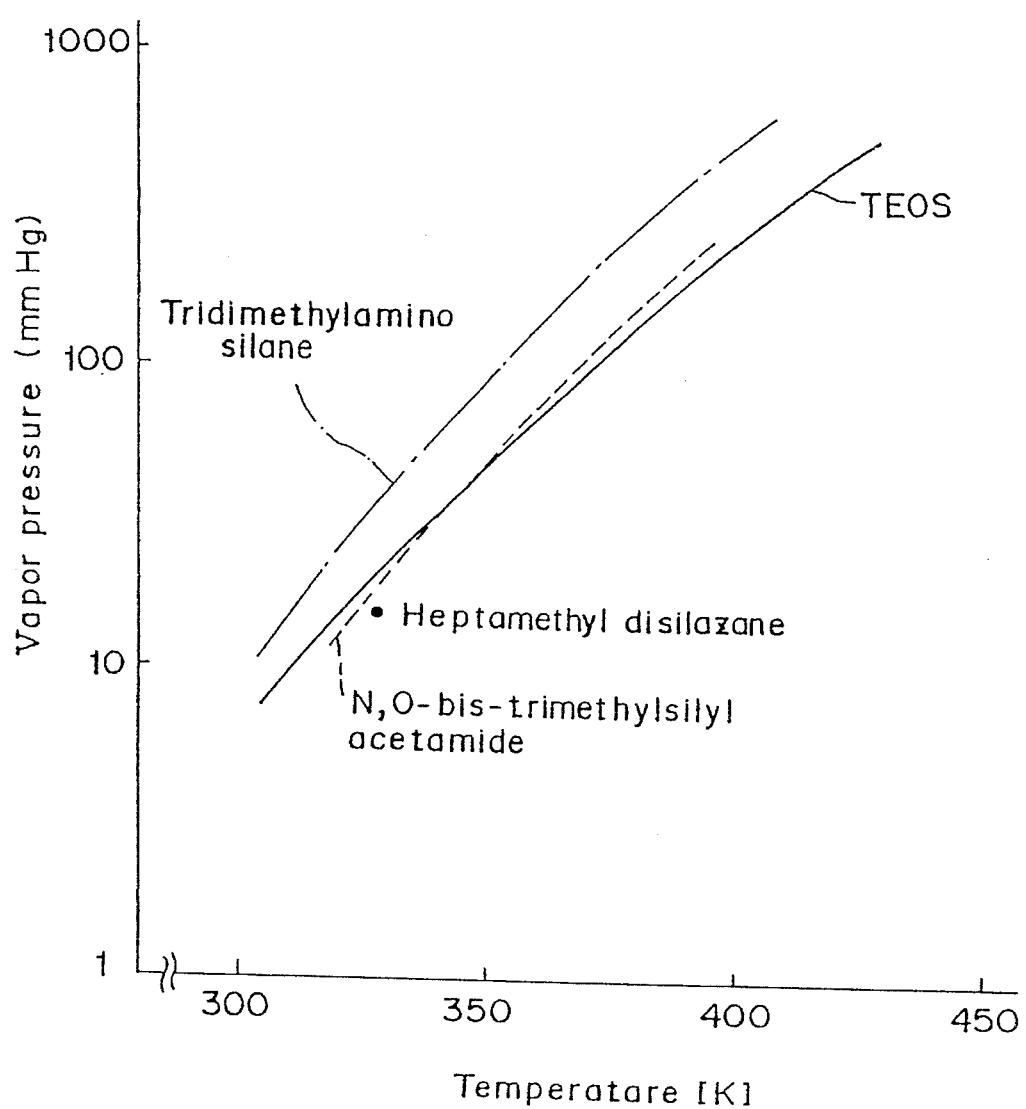
FIG. 2 is a graphic representation showing the relationship between vapor pressure and temperature with respect to individual nitrogen sources.

Measurements of actually grown films revealed that, as Table 1 below shows, where nitrogen source 17 was added, the moisture content of the film was not more than 0.1 wt %, or a substantial quality improvement over the conventional level (moisture content of 1 to 3 wt %). Where heptamethyl disilazane, N, O-bis-trimethylsilyl acetamide, and tridimethylamino silane were each used as nitrogen source 17, the carbon concentration in the film was not more than $10^{18}$ atm/cm$^3$ in each case, or a level comparable to the case of no nitrogen source being added. This is considered to be attributable to the fact that the vapor pressure of each of these sources is close to that of TEOS (see FIG. 2) and is highly reactive. In contrast, where hexamethyl disilazane (chemical formula $(CH_3)_3Si$—$(NH)Si(CH_3)_3$) was used, the carbon concentration in the film was at best $10^{20}$ atom/cm$^3$ or less.

TABLLE 1

| Nitrogen Source | Moisture Content | Carbon Concentration |
|---|---|---|
| nil (conventional) | 1 to 3 wt % | $<10^{18}$ atm/cm$^3$ |
| Heptamethyl disilazane | <0.1% | $<10^{18}$ atm/cm$^3$ |
| N, O-bis-trimethylsilyl acetamide | <0.1% | $<10^{18}$ atm/cm$^3$ |
| Tridimethylamino silane | <0.1% | $<10^{18}$ atm/cm$^3$ |
| Hexamethyl disilazane | <0.1% | $<10^{20}$ atm/cm$^3$ |

As is clear from the above, the semiconductor device manufacturing process according to this first example is an organic source-$O_3$ system normal pressure CVD process, wherein a nitrogen source or a source containing nitrogen in its composition is added to an organic source thereby to grow a film. Therefore, film deposition at a low temperature is possible and an interlayer insulating film of good quality can be formed which has good surface smoothness and yet has less moisture content.

Where the nitrogen source is heptamethyl disilazane, N, O-bis-trimethylsilyl acetamide, or tridimethylamino silane (chemical formula: $((CH_3)_2N)_3SiN$), such a nitrogen source can be easily added to the organic source by bubbling. Furthermore, such nitrogen source is contributive toward reactivity enhancement to thereby reduce the carbon concentration in the resulting film and also toward film quality improvement.

(SECOND EXAMPLE)

Figure 3:
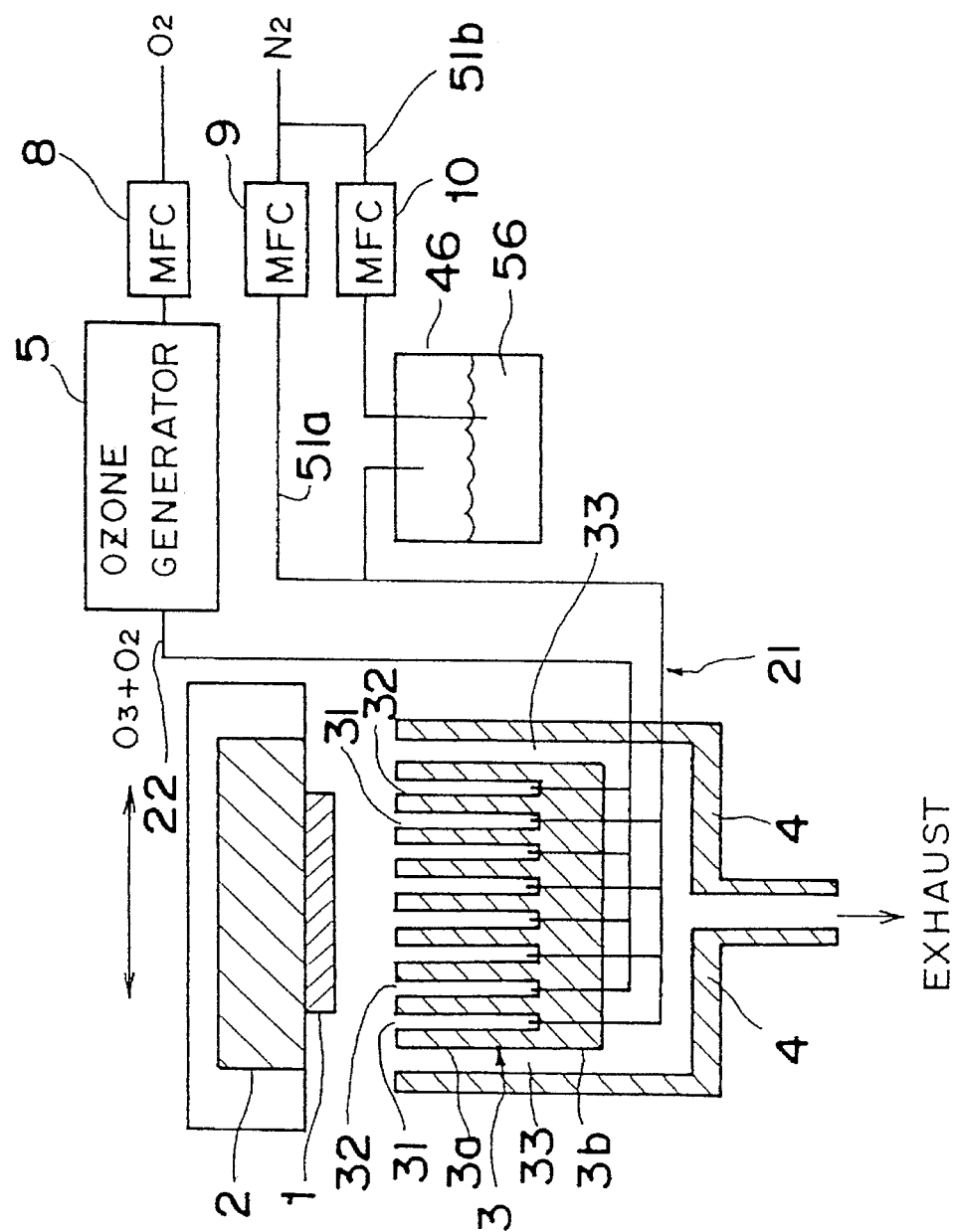
FIG. 3 is a block diagram showing an organic source-$O_3$ system normal pressure CVD apparatus employed in one example of the process of the invention.

FIG. 3 illustrates an organic source-$O_3$ system normal pressure CVD apparatus for growing a silicon oxide film according to this second example of the process of the invention. The apparatus includes a heater 2 capable of keeping a substrate 1 at a predetermined temperature, and a dispersion head 3 facing the substrate 1 and covered with a cover 4. At the substrate side 3a of the dispersion head 3 are alternately arranged slits 31, 32 for jetting gases. At a lower portion 3b of the dispersion head 3 a gas system 21 is connected to the slits 31 for supply of an organic source thereto, and a gas system 22 is connected to the slits 32 for supply of $O_3$ and $O_2$ gases thereto. An atmosphere $N_2$ system 51a and a carrier $N_2$ system 51b join into the gas system 21. The atmosphere $N_2$ system 51a has a mass flow controller 9 and supplies atmosphere $N_2$ gas to the dispersion head 3 at a predetermined flow rate. The carrier $N_2$ system 51b has a mass flow controller 10 and a source vessel 46 in which an organic source 56 having an Si—N bond in its composition is stored, and supplies to the dispersion head 3 hexamethyl disilazane 56 bubbled with a predetermined flow of $N_2$ gas. In the present example, hexamethyl disilazane $((CH_3)_3Si—N(H)—Si(CH_3)_3)$ is used as an organic source 16 having an Si—N bond in its composition. Since hexamethyl disilazine (HMDS) has a higher vapor pressure than TEOS, the flow rate of carrier $N_2$ gas can be reduced. The gas system 22 has a mass flow controller 8 and an ozone generator 5, and supplies $O_3$ and $O_2$ gases to the dispersion head 3 at predetermined flow rates and in a predetermined proportion.

For actual film growth, the temperature of the substrate 1 is set at 410° C. by the heater 2, and the temperature of hexamethyl disilazane 16 is kept at 65° C. The flow rate of atmosphere $N_2$ gas is set at 18 SLM, and the flow rate carrier of $N_2$ gas for bubbling hexamethyl disilazane 16 at 0.4 SLM, respectively by mass flow controllers 9, 10. The flow rate of $O_2$ gas is set at 7.5 SLM by the mass controller 8, and the amount of $O_3$ in the $O_2$ gas is set at 5 wt % by the ozone generator 5. Under these growth conditions, the different gases are directed to the substrate 1 via the slits 31, 32 while the substrate 1 is moved rightward and leftward in FIG. 3, so that silicon oxide film is grown. Gases after reaction are exhausted through a clearance 33 between the dispersion head 3 and the cover 4.

Figure 4:
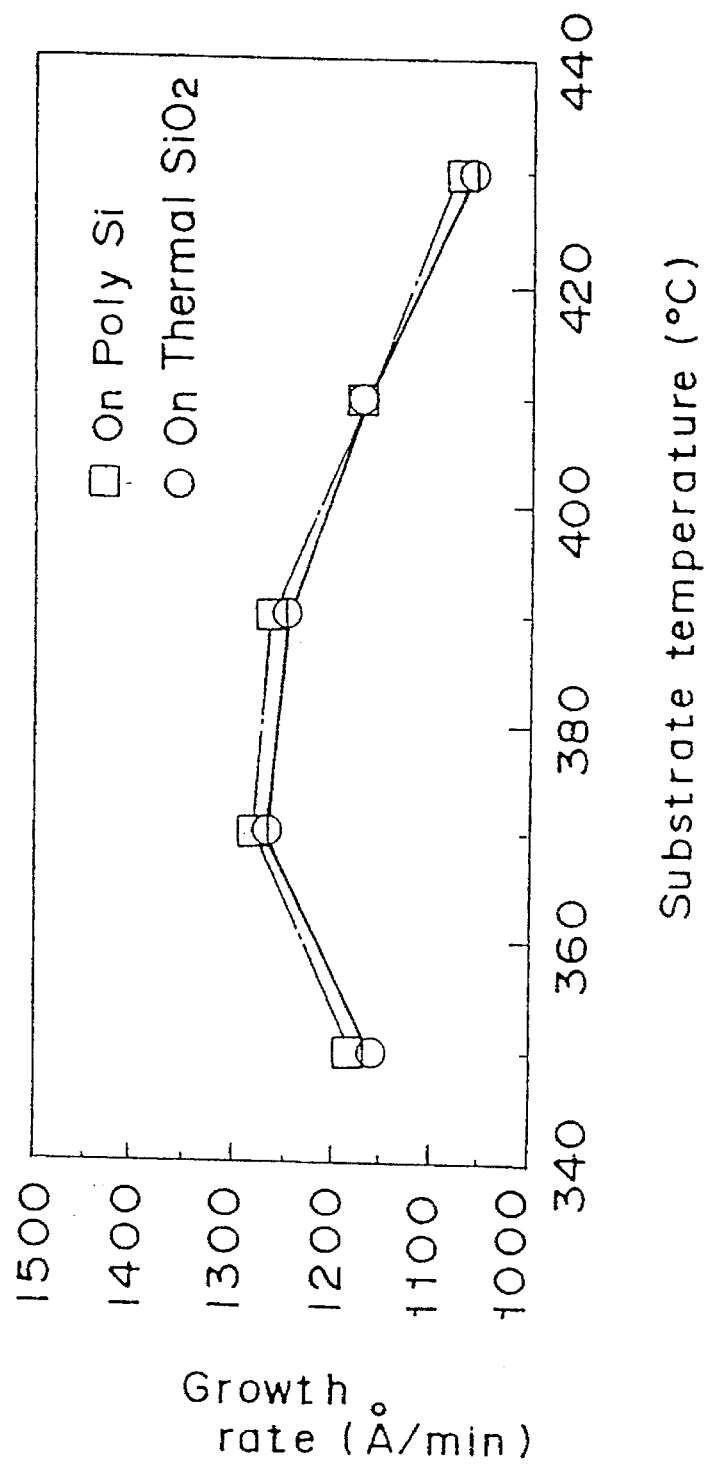
FIG. 4 is a graph showing the relationship between growth rate and substrate temperature with respect to silicon oxide films formed according to a film growing method of one example of the invention.
Figure 5:
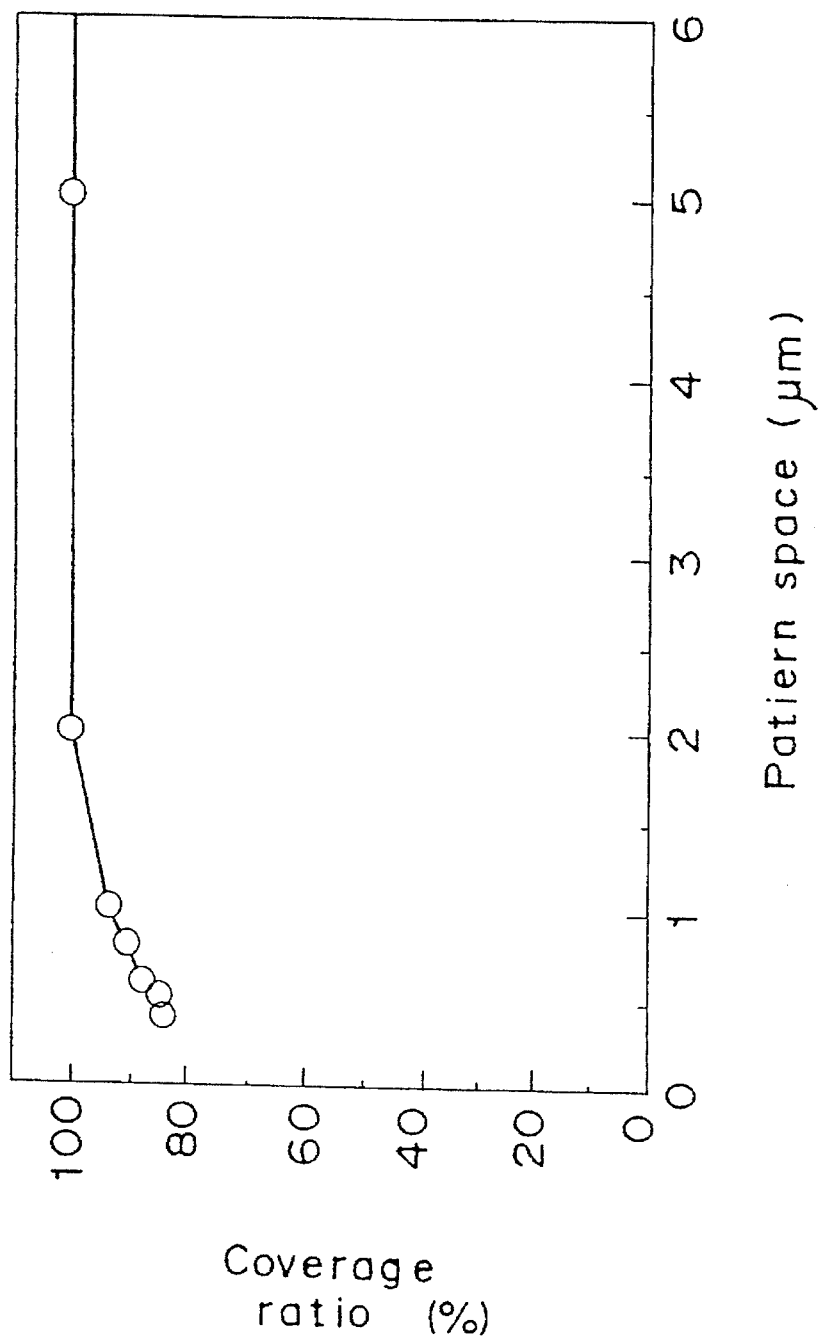
FIG. 5 is a graph showing the relationship between coverage ratio and pattern space when silicon oxide films are formed according to the above film growing method.

Evaluation of films grown on different substrates 1 witnessed that silicon oxide films were grown at a substantially uniform growth rate irrespective of the kind of substrate material. For example, as FIG. 4 shows, where poly Si and thermal $SiO_2$ substrates were used, growth rates on them were substantially equal (□ represents the rate of growth on the poly Si substrate and ○ represents that on the thermal $SiO_2$). Where a film was grown on a line and space (L/S) pattern (in which depressions and projections are cyclically repeated and in which depressions and projections are of identical width), as FIG. 5 shows, a coverage ratio (film thickness on depressions/film thickness on projections) of 80% or more was witnessed even to the extremity of a pattern space (width of depression or projection) of 0.5 μm, the film thus exhibiting good surface covering characteristics. Also, as shown in Table 2, the rate of etching with a 0.5% HF liquid was 225 Å/min. and the film shrinkage by annealing at 800° C./30 min. was 5.8%, which meant a good quality level comparable to that in the case of TEOS-$O_3$ reaction being utilized (e.g., etching rate: 220 Å/min.; film shrinkage: 6.0%).

TABLE 2

| Organic Source | Etching Rate (0.5% HF) | Film Shrinkage (800° C. 30 min.) |
|---|---|---|
| TEOS | 220 Å/min. | 6.0% |
| Hexamethyl disilazane | 225 Å/min. | 5.8% |

Figure 6A:
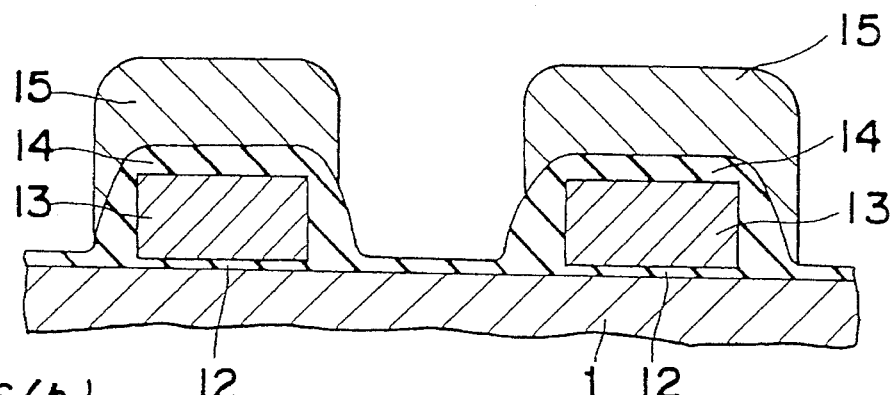
FIGS. 6(a), 6(b), and 6(c) are views for explaining the stages for smoothing substrate surfaces by employing the above film growing method.
Figure 6B:
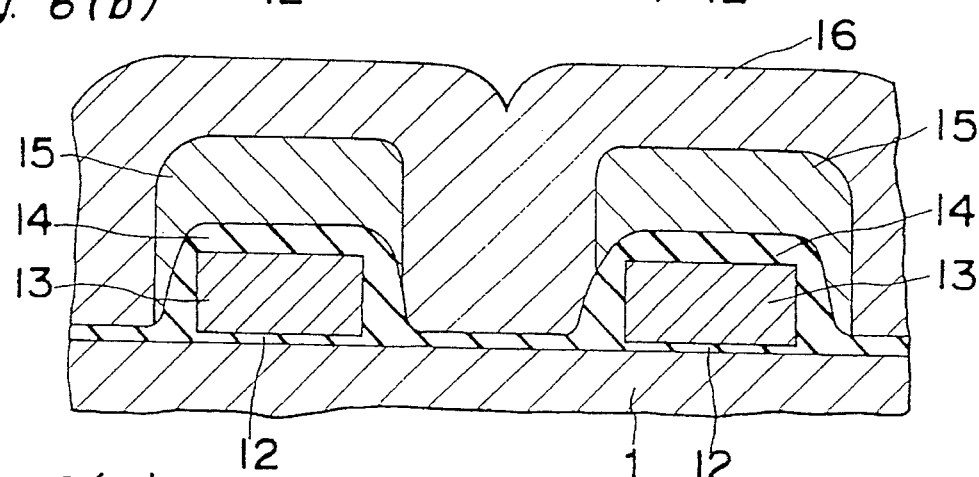
Figure 6C:
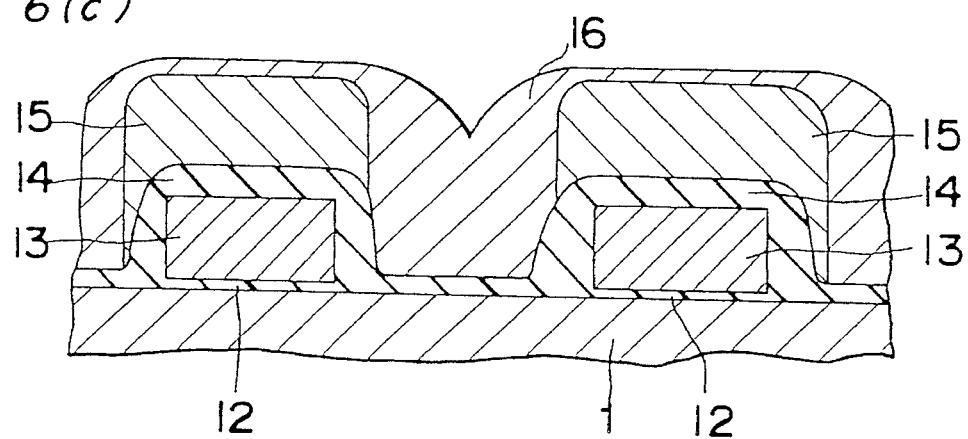
Figure 7:
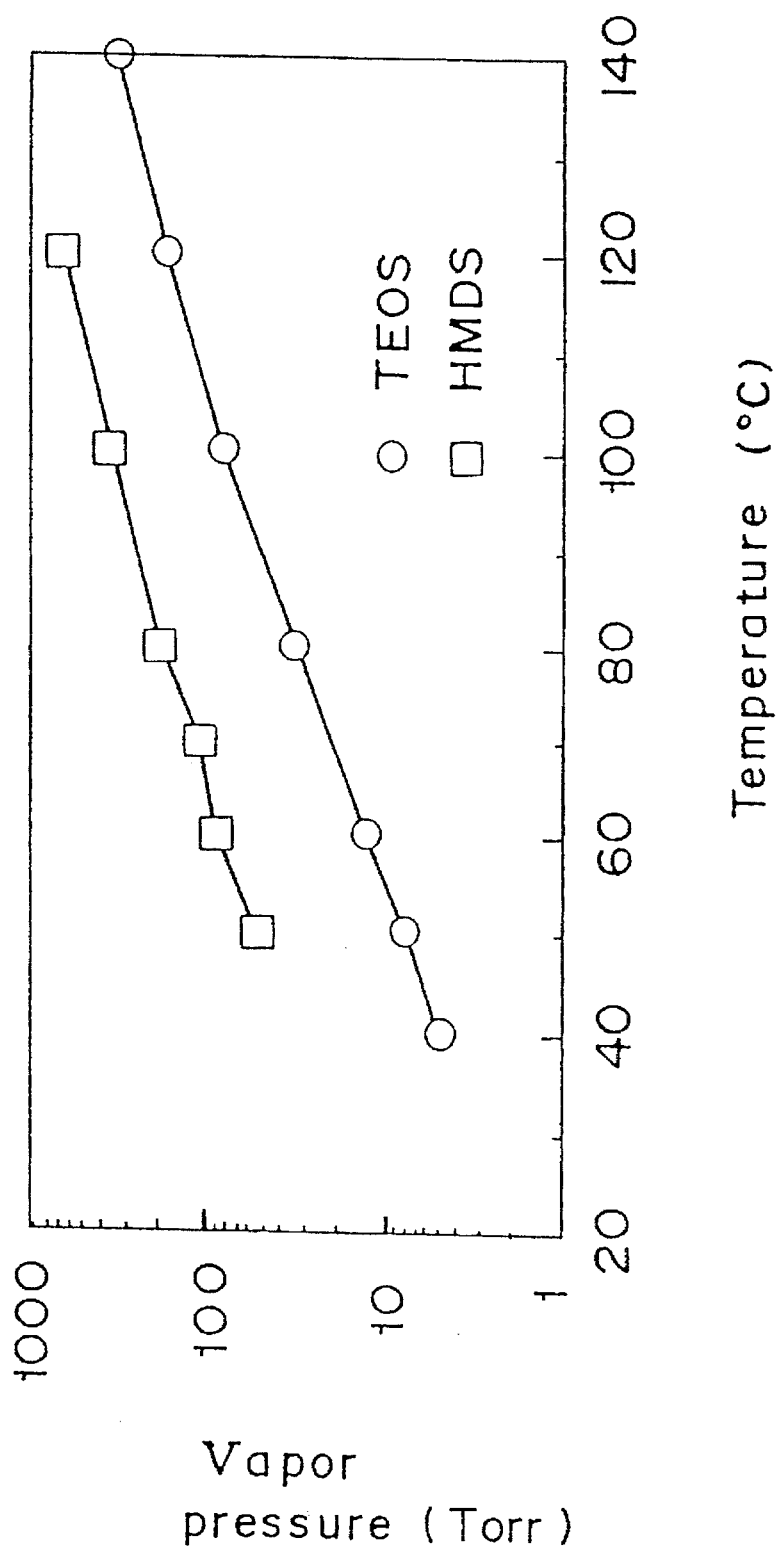
FIG. 7 is a graph showing the relationship between vapor pressure and temperature with respect to hexamethyl disilazane and TEOS.
Figure 8:
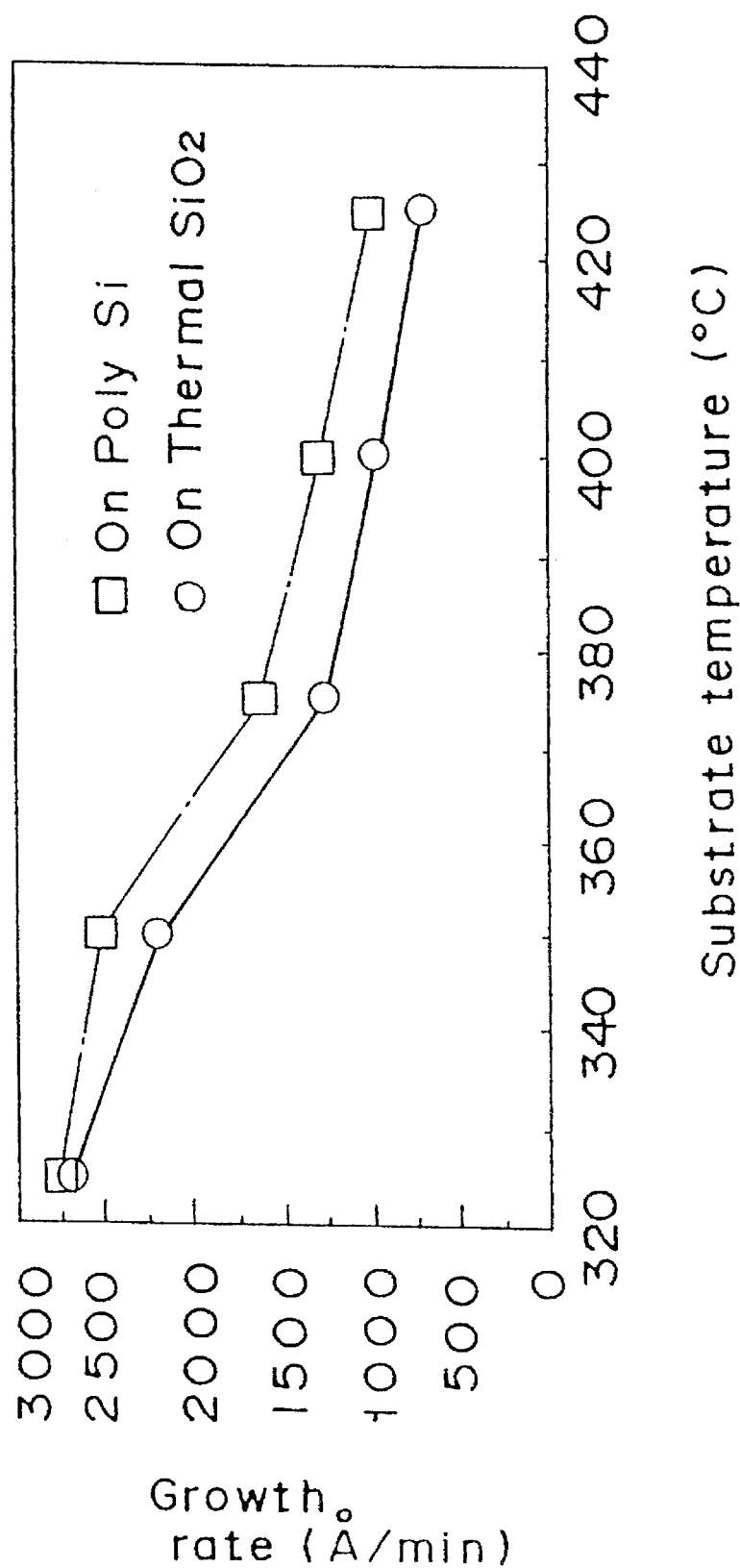
FIG. 8 is a graph showing the dependence of silicon oxide films upon substrate material in the TEOS-$O_3$ system normal pressure CVD process.

Smoothing of substrate surface is carried out in the following way by using the above described method for film growth. It is assumed that, as FIG. 6(a) shows, a gate insulating film 12, gate electrodes 13 arranged at a predetermined pitch, and an interlayer insulating film 14 have already been formed, with upper electrodes 15 formed on the gate electrodes 13. Then, as FIG. 6(b) shows, a silicon oxide film 16, as an interlayer insulating film, is grown all over by employing the foregoing growth method. Subsequently, the silicon oxide film 16 is etched all over by dry etching. In this way, it is possible to adjust the film thickness and also to smooth the substrate surface.

As may be clear from the above description, the semiconductor device manufacturing process according to this second example comprises conducting to the substrate an organic source having an Si—N bond in its composition and $O_3$, and causing the organic source and $O_3$ to react with each other under normal pressures thereby to grow a silicon oxide film on the substrate. Therefore, it is possible to form a silicon oxide film at a uniform growth rate irrespective of the material of the substrate, the film having good surface smoothing and good quality characteristics.

Where the organic source is hexamethyl disilazane, the reaction between hexamethyl disilazane and $O_3$ enables to form on the substrate a silicon oxide film of satisfactory quality at a uniform growth rate irrespective of the material of the substrate, the silicon oxide film having satisfactory surface smoothness.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for manufacturing a semiconductor device, said process comprising the step of growing a silicon oxide film on a substrate at around atmospheric pressure by reacting ozone and an organosilicon compound containing nitrogen to cause said silicon oxide film to grow on said substrate.

2. A process according to claim 1, wherein said organosilicon compound is heptamethyl disilazane.

3. A process according to claim 1, wherein the organosilicon compound is N, O-bis-trimethylsilyl acetamide.

4. A process according to claim 1, wherein the organosilicon compound is tridimethylamino silane.

5. A process according to claim 1, wherein the organosilicon compound is hexamethyl disilazane.

6. A process for manufacturing a semiconductor device, said process comprising the step of growing a silicon oxide film on a substrate at around atmospheric pressure by reacting ozone and an organosilicon compound containing a Si—N bond to cause said silicon oxide film to grow on said substrate.

7. A process according to claim 6, wherein the organosilicon compound is hexamethyl disilazane.

* * * * *